United States Patent
Suda (10) Patent No.: US 8,030,662 B2
(45) Date of Patent: *Oct. 4, 2011

(54) SEMICONDUCTOR MEMORY DEVICE

(75) Inventor: Yoshiyuki Suda, Koganei (JP)

(73) Assignee: National University Corporation Tokyo University of Agriculture and Technology, Fuchu-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/745,146

(22) PCT Filed: Sep. 8, 2008

(86) PCT No.: PCT/JP2008/066499
§ 371 (c)(1),
(2), (4) Date: May 27, 2010

(87) PCT Pub. No.: WO2009/069364
PCT Pub. Date: Jun. 4, 2009

(65) Prior Publication Data
US 2010/0301301 A1    Dec. 2, 2010

(30) Foreign Application Priority Data

Nov. 30, 2007  (JP) .................................. 2007-310663

(51) Int. Cl.
*H01L 29/15* (2006.01)
*H01L 31/0312* (2006.01)
(52) U.S. Cl. ...................... 257/77; 257/E27.07; 438/931
(58) Field of Classification Search .......................... None
See application file for complete search history.

(56) References Cited

U.S. PATENT DOCUMENTS

| 6,169,688 | B1 | 1/2001 | Noguchi |
| 6,573,586 | B2 | 6/2003 | Sakata et al. |
| 7,362,609 | B2 | 4/2008 | Harrison et al. |
| 7,569,846 | B2 | 8/2009 | Choi et al. |

(Continued)

FOREIGN PATENT DOCUMENTS

EP          1 418 620       5/2004

(Continued)

OTHER PUBLICATIONS

International Search Report mailed Dec. 16, 2008, directed to International Patent Application No. PCT/JP2008/066499; 2 pages.

(Continued)

*Primary Examiner* — Hoang-Quan Ho
(74) *Attorney, Agent, or Firm* — Morrison & Foerster LLP (57) ABSTRACT

There is offered a switching resistance RAM that is very much reduced in an occupied area and is highly integrated. Memory cells CEL11-CEL14 are formed corresponding to four intersections of word lines WL0 and WL1 and bit lines BL0 and BL1. Each of the memory cells CEL11-CEL14 are composed of a switching layer 13 formed on a surface of an N+ type Si layer 11. The switching layer 13 is electrically connected to the bit line BL0 or BL1 thereabove through an electrode 14. The switching layer 13 is composed of a SiC layer 13A stacked on the surface of the N+ type Si layer 11 and a Si oxide layer 13B stacked on the SiC layer 13A. A top surface of the Si oxide layer 13B, that is the uppermost layer of the switching layer 13, is electrically connected to the corresponding bit line BL0 or BL1.

2 Claims, 9 Drawing Sheets

U.S. PATENT DOCUMENTS

| | | | |
|---|---|---|---|
| 2003/0155569 A1* | 8/2003 | Lee | 257/20 |
| 2004/0090822 A1 | 5/2004 | Yoo et al. | |
| 2008/0054270 A1* | 3/2008 | Suda | 257/77 |
| 2010/0308341 A1 | 12/2010 | Suda et al. | |

FOREIGN PATENT DOCUMENTS

| | | |
|---|---|---|
| JP | 6-275791 | 9/1994 |
| JP | 11-345485 | 12/1999 |
| JP | 2002-367365 | 12/2002 |
| JP | 2004-158863 | 6/2004 |
| JP | 2005-538552 | 12/2005 |
| JP | 2006-313912 | 11/2006 |

OTHER PUBLICATIONS

International Search Report mailed Dec. 16, 2008, directed to International Patent Application No. PCT/JP2008/066500; 4 pages.

Takada, K. et al. (1999). "Memory Function of a SiO2/β-SiC//Si MIS Diode." *Extended Abstracts of the 1999 International Conference on Solid State Devices and Materials*. 132-133.

Hosoi, Y. et al. (2006). "High speed Unipolar Switching Resistance RAM (RRAM) Technology." IEDM 2006 30-7 (IEEE). 4 pages.

* cited by examiner

(1) OFF
No voltage is applied.
There exist donor levels in the oxide film and at the interface.

(2) OFF
Positive voltage is applied.
The voltage is imposed on the oxide film and SiC.

(3) OFF→ON
Further positive voltage is applied. Electrons are captured by the donor levels, electric field in SiC is weakened, more voltage is imposed on the oxide film, and strong electric field is imposed only on the oxide film. Electrons make tunneling through the oxide film by the electric field (ON state).

SEMICONDUCTOR MEMORY DEVICE

REFERENCE TO RELATED APPLICATIONS

This application is a national stage application under 35 USC 371 of International Application No. PCT/JP2008/066499, filed Sep. 8, 2008, which claims priority from Japanese Patent Application No. 2007-310663, filed Nov. 30, 2007, the contents of which prior applications are incorporated herein by reference.

FIELD OF THE INVENTION

This invention relates to a semiconductor memory device using a two-terminal memory cell that is made of a Si layer, a SiC layer and a Si oxide layer.

BACKGROUND OF THE INVENTION

In recent years, the semiconductor memory device is used as a memory device to store information in various fields. A flash memory, a RAM, a ROM and the like are used as conventional semiconductor memory devices. They are three-terminal memories that require three control electrodes. In recent years, as an amount of stored information is required to increase, a two-terminal memory that can be controlled with two electrodes is expected to appear. The two-terminal memory takes less occupied area per one unit of memory on a circuit board since it has reduced number of electrodes compared with the three-terminal memory. Therefore, the number of memories per unit area of the circuit board can be increased, and the amount of information per area, that is, a density of the stored information can be expanded. Therefore, a memory device capable of handling a larger amount of information can be manufactured with a board of a small area.

In recent years, a switching resistance RAM is studied as the two-terminal memory. The switching resistance RAM has a structure in which a memory cell formed using a switching layer that switches between an ON state and an OFF state by applying a voltage is connected at an intersection of a bit line and a word line. The switching layer can be regarded as a resistive element in terms of an equivalent circuit, and has a property that its resistance is reduced in the ON state and increased in the OFF state. Writing-in, reading-out and erasing of data can be made by controlling voltages applied to the bit line and the word line.

Figure 13:
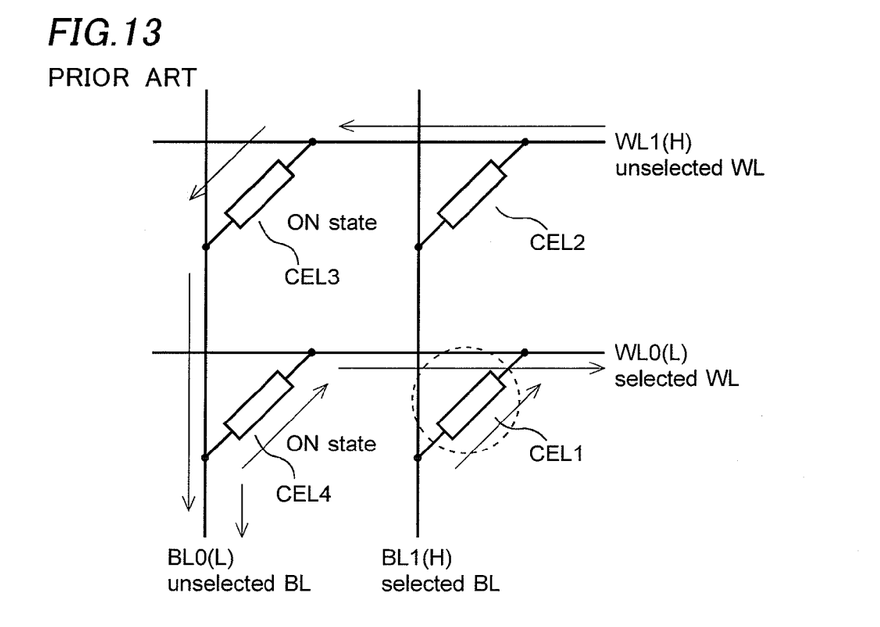
FIG. 13 is a circuit diagram showing a structure of a conventional semiconductor memory device.

FIG. 13 shows the structure of the switching resistance RAM as described above. Each of memory cells CEL1-CEL4 that include the switching layer is connected at each of intersections of word lines WL0 and WL1 and bit lines BL0 and BL1, respectively.

Now, suppose the memory cell CEL1 is selected. At that time, the bit line BL1 and the word line WL0 are selected, and their electric potentials are set to an H level and an L level, respectively. An electric potential of the unselected bit line BL0 is set to the L level, and an electric potential of the unselected word line WL1 is set to the H level. Thus, an electric current flowing through the selected memory cell CEL1 can be sensed when a current sense amplifier is connected to the bit line BL1. That is, since the electric current is large when the memory cell CEL1 is set to the ON state and small when it is set to the OFF state, the data ("1" or "0") stored in the memory cell CEL1 can be read-out based on a result of sensing by the current sense amplifier.

Y. Hosoi et al. "High speed Unipolar Switching Resistance RRAM (RRAM) Technology" IEDM 2006 30-7 and K. Takada, M. Fukumoto, Y. Suda, "Memory Function of a SiO$_2$/β-SiC/Si MIS Diode" Ext. Abs. 1999 International Conference on Solid State and Materials, p. 132-133 (1999) are named as examples of related technical documents.

SUMMARY OF THE INVENTION

In the switching resistance RAM described above, there is a problem that an unnecessary sneak current flowing through the unselected word line occurs during reading-out, and current consumption becomes very large. The sneak current is explained hereafter, using FIG. 13.

Now, suppose the memory cells CEL3 and CEL4 are set to the ON state. Then, because the electric potential of the unselected word line WL1 is at the H level, the sneak current flows from the word line WL1 to the word line WL0, that is selected and at the L level, through the memory cells CL3 and CL4. Since the sneak current occurs also from the other unselected word lines that are not shown in the drawing, the consumption current becomes very large. In addition, when the sneak current flows into the selected word line WL0, the electric potential of the word line WL0 is raised to cause another problem that the current flowing through the selected memory cell CEL1 is reduced.

Figure 14:
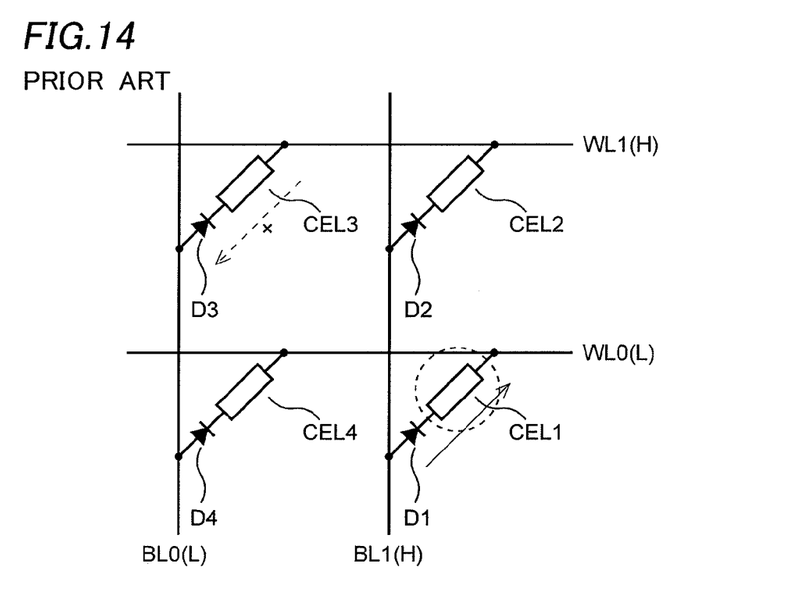
FIG. 14 is a circuit diagram showing a structure of a conventional semiconductor memory device.

Here, the unselected memory cell CEL3 is biased in an opposite direction to the selected memory cell CEL1. The sneak current occurs since the current flows through the unselected memory cell CEL3 that is biased in the opposite direction. Thus, it is conceived that each of diodes D1-D4 is connected in series with the switching layer in each of the memory cells CEL1-CEL4 as shown in FIG. 14, so that the sneak current is prevented from occurring.

Figure 15:
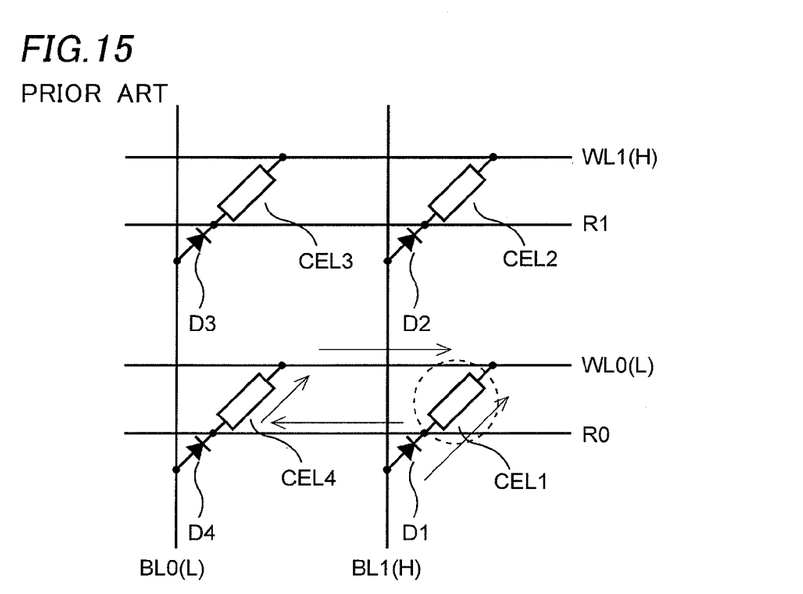
FIG. 15 is a circuit diagram showing a structure of a conventional semiconductor memory device.

However, there is a problem that the number of elements to form the memory cell is increased and the occupied area is increase. Also, while turning the memory cells CL1-CL4 from the ON state to the OFF state requires feeding a reverse current through the switching layer in a direction opposite to the direction of current during the reading-out, that is, in a direction from the word line to the bit line, it is not possible to feed the reverse current when the diodes D1-D4 are provided as described above. Although this problem can be solved by providing reset electrodes R1 and R0 as shown in FIG. 15 so that the reverse current is fed through the switching layer bypassing the diodes D1-D4, it is inevitable that the number of elements further increases to increase the occupied area.

A semiconductor memory device of this invention is made in consideration of the issues described above, and is characterized by being provided with a substrate, a plurality of word lines made of a plurality of Si layers extending over a surface of the substrate, a plurality of bit lines extending over the substrate and intersecting with the plurality of word lines, and a switching layer formed on a surface of the Si layer at each of intersections between the bit lines and the word lines and switching between an ON state and an OFF state, wherein the switching layer includes a SiC layer stacked on the Si layer and a Si oxide layer stacked on the SiC layer and the Si oxide layer is electrically connected to the bit line.

According to the semiconductor device of this invention, the switching layer is composed of the SiC layer stacked on the Si layer and the Si oxide layer stacked on the SiC layer. With the structure as described above, a reverse current that flows when the switching layer is reverse biased can be made as small as a reverse leakage current of a diode. This is because the switching layer has a function of a diode. Also, applying a reverse voltage to the switching layer is enough to turn the switching layer from the ON state to the OFF state, and there is no need to feed a large reverse current.

Therefore, since there is no need to provide the diodes and the reset electrodes in addition to the switching layers as in the conventional art, the occupied area of the memory cell can be made very small, thus a highly integrated switching resistance RAM can be realized as a result.

DETAILED DESCRIPTION OF THE INVENTION

Figure 1:
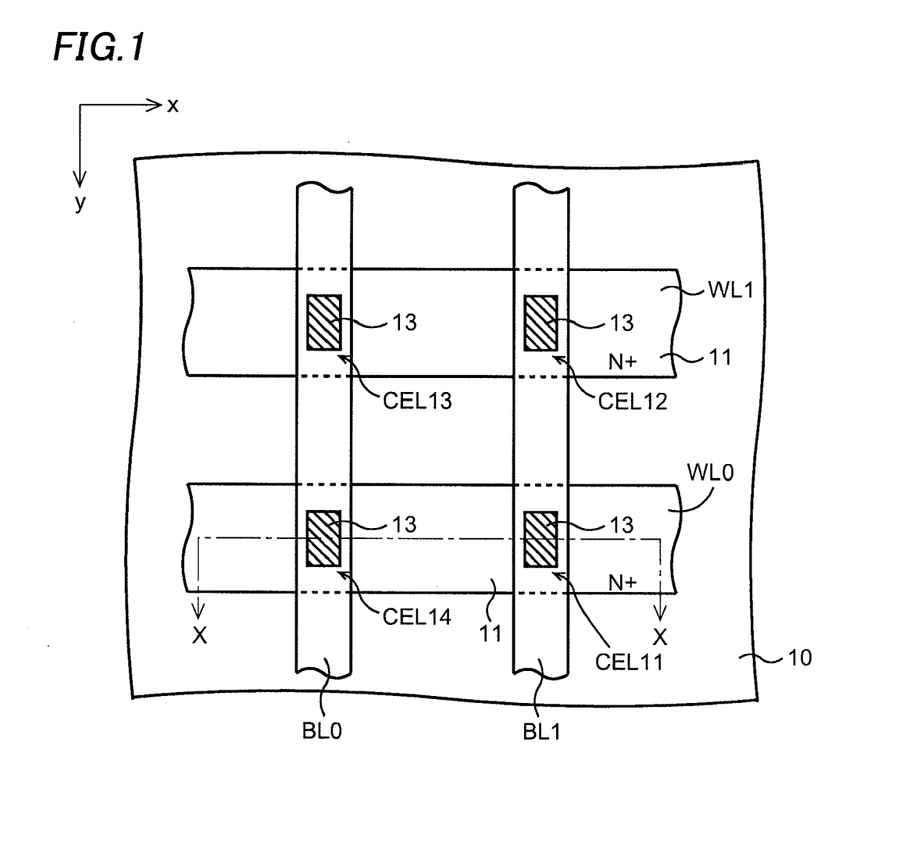
FIG. 1 is a plan view of a semiconductor memory device according to an embodiment of this invention.
Figure 2:
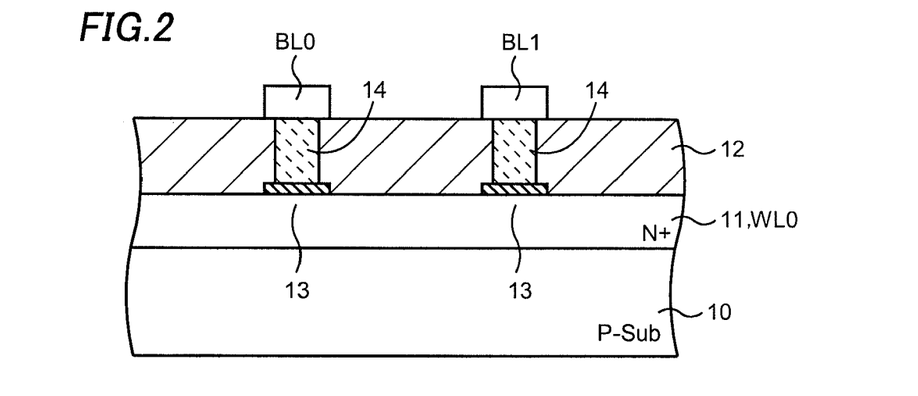
FIG. 2 is a cross-sectional view of a section X-X shown in FIG. 1.

A semiconductor memory device according to an embodiment of this invention is explained referring to the drawings. FIG. 1 is a plan view of the semiconductor memory device. FIG. 2 is a cross-sectional view showing a section X-X in FIG. 1. Two word lines WL0 and WL1 made of N+ type Si layers 11 extend over a surface of a P type Si (silicon) substrate 10 in an x direction. And two bit lines BL0 and BL1 made of conductive material extend over the two word lines WL0 and WL1 through an interlayer insulating film 12 in a y direction so as to intersect with the word lines WL0 and WL1.

Memory cells CEL11-CEL14 are formed corresponding to four intersections of the word lines WL0 and WL1 and the bit lines BL0 and BL1. Each of the memory cells CEL11-CEL14 are composed of a switching layer 13 formed on a surface of the N+ type Si layer 11. And a contact hole is formed in the interlayer insulating film 12 on the switching layer 13. A top surface of each of the switching layers 13 is electrically connected to corresponding each of the bit lines BL0 and BL1 through an electrode 14 formed in the contact hole.

Figure 3:
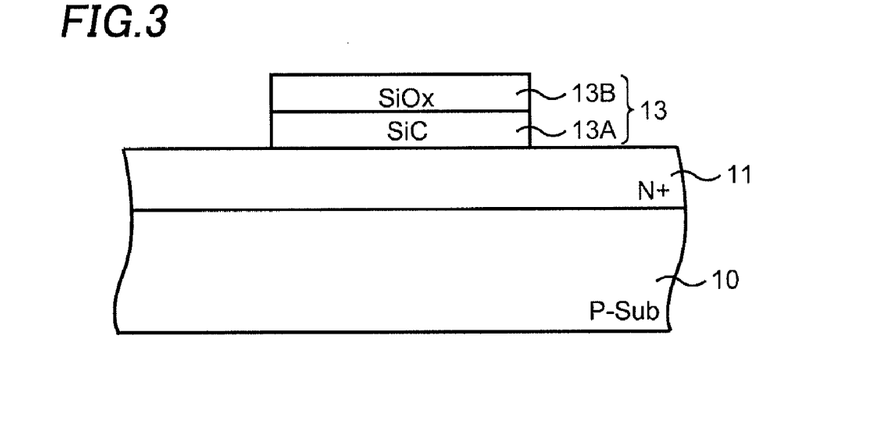
FIG. 3 is a cross-sectional view showing a structure of a switching layer.

The switching layer 13 is composed of a SiC (silicon carbide) layer 13A stacked on the surface of the N+ type Si layer 11 and a Si oxide layer 13B stacked on the SiC layer 13A, as shown in FIG. 3. As a result, a top surface of the Si oxide layer 13B that is the uppermost layer of each of the switching layers 13 is electrically connected to the corresponding each of the bit lines BL0 and BL1. Note that although only two bit lines BL0 and BL1 and two word lines WL0 an WL1 are shown in FIG. 1 for the sake of convenience, many more bit lines and word lines of similar structure are provided in the actual semiconductor memory device and the memory cells are formed at intersections of them.

And the bit lines BL0 and BL1 or the word lines WL0 and WL1 are provide with sense amplifiers, that are not shown in the drawing, in order to sense a current flowing through the memory cells CEL11-CEL14. In addition, there are provided electric potential applying means that are not shown in the drawings in order to apply electric potentials corresponding to writing-in, reading-out and erasing to the bit lines BL0 and BL1 and the word lines WL0 and WL1.

Figure 4:
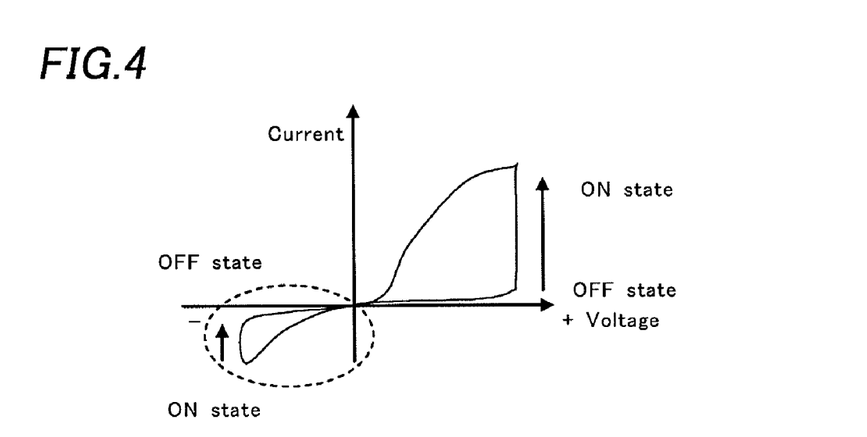
FIG. 4 shows electric characteristics of the switching layer.

Brief explanation on electric characteristics of the switching layer 13 is given here referring to FIG. 4, while various characteristics and a manufacturing method of it will be explained later in detail. FIG. 4 shows a correlation between a voltage applied to the switching layer 13 and a current flowing through the switching layer 13. It is assumed that it is a positive voltage, that is, a forward voltage that is applied when the current flows from the bit line over the switching layer 13 to the word line, and that it is a negative voltage, that is, a reverse voltage that is applied when the current inversely flows from the word line to the bit line. In practice, the voltage applied to the switching layer 13 is generated by controlling the electric potentials applied to the bit lines and the word lines with the electric potential applying means.

When the switching layer 13 is in the OFF state (erased state), it is in a high resistance state and the current is very small even when the positive voltage is applied. When the positive voltage is further increased, a transition from the OFF state to the ON state (written-in state) takes place and the switching layer 13 turns to a low resistance state, so that a larger current compared with that in the OFF state flows when the positive voltage is applied.

And a reverse current flows when the negative voltage is applied in the ON state. And when the negative voltage is increased, a transition from the ON state to the OFF state takes place, the switching layer 13 resumes to the erased state that is the high resistance state, and almost no reverse current flows.

During reading-out, a positive voltage not high enough to cause the transition from the OFF state to the ON state may be applied, and a cell current flowing to the bit line or the word line through the switching layer 13 is sensed by the sense amplifier.

According to the structure of the switching layer 13 described above, the inventors have confirmed that the reverse current in a portion encircled by a dashed line in FIG. 4 can be made as small as a reverse leakage current of a diode. This is because the switching layer 13 has a function of the diode. Therefore, the circuit of this embodiment is equivalent to the circuit as shown in FIG. 14, which incorporates the diodes. And applying a certain level of large negative voltage is sufficient to turn the switching layer 13 from the ON state to the OFF state, and feeding a large reverse current is not necessary.

Therefore, the sneak current can be prevented without providing the diodes and the reset electrodes in addition to the switching layers 13 as in the conventional art. And since there is no need to provide the diodes and the reset electrodes in addition, the occupied area of the memory cells can be made very small, thus a highly integrated switching resistance RAM can be realized as a result.

The operations of the semiconductor memory device described above are hereafter explained more in detail, referring to FIG. 1, FIG. 2 and Table 1.

TABLE 1

| Operation mode | Writing-in | Reading-out | Erasing |
|---|---|---|---|
| Selected bit line BL | H+ | H | L |
| Unselected bit line BL | L | L | FL |
| Selected word line WL | L | L | H+ |
| Unselected word line WL | H or FL | H | FL |

In the following explanations, an H+ level is a positive electric potential high enough to turn the state of the switching layer 13 from the OFF state to the ON state, and an H level is a positive electric potential that is lower than the H+ and not high enough to cause the transition of the state of the switching layer 13. And an L level is a lower electric potential than the H level, and is usually a ground electric potential. And "FL" indicates that it is in a floating state.

[Writing-in Operations]

Now suppose the memory cell CEL11 at the intersection of the bit line BL1 and the word line WL0 is selected. At that time, an electric potential of the bit line BL1 is set to the H+ level and an electric potential of the word line WL0 is set to the L level. Assuming that an initial state of the memory cell CEL11 is the OFF state (erased state), the switching layer 13 is turned from the OFF state to the ON state.

Regarding the memory cell CEL12, since the selected bit line BL1 is set to H+ and the unselected word line WL1 is set to the H level or the floating state, a large voltage is not applied to the switching layer 13 and there is no change in the ON/OFF state. And regarding the memory cell CEL13, although the reverse voltage is applied when the unselected word line WL1 is set to the H level since the electric potential of the bit line BL0 is at the L level, there is no change in the ON/OFF state because the reverse voltage is not large. Furthermore, regarding the memory cell CEL14, since both the bit line BL0 and the word line WL0 are at the L level, no voltage is applied to the switching layer 13 and there is no change in the ON/OFF state.

[Reading-out Operations]

Now, suppose the memory cell CEL11 is selected. At that time, the electric potential of the bit line BL1 is set to the H level and the electric potential of the word line WL0 is set to the L level. The H level of the bit line BL1 is not high enough to cause the transition from the OFF state to the ON state. Thus, the read-out current flows through the memory cell CEL11. At that time, the unselected word line WL1 is set to the H level and the unselected bit line BL0 is set to the L level. Thus, although the reverse voltage is applied to the switching layer 13 of the memory cell CEL13, a large sneak current does not occur because the reverse current is as small as the reverse leakage current of a diode as described above.

[Erasing Operations]

Now, suppose the memory cell CEL11 is selected. At that time, the electric potential of the bit line BL1 is set to the L level and the electric potential of the word line WL0 is set to the H+ level. Thus, a large reverse voltage is applied to the memory cell CEL11, and the switching layer 13 of the memory cell CEL11 is turned from the ON state to the OFF state. And as long as the unselected bit line BL0 and the unselected word line WL1 are set to the floating state at that time, the large reverse voltage is not applied to the switching layers 13 of the memory cells CLE12-CLE 14 and there is no change in the ON/OFF state.

Various characteristics, the manufacturing method and a preferable structure of the memory cell using the switching layer 13 are hereafter explained in detail. In the following explanations, "Si" corresponds to the N+ type Si layer 11, "SiC" corresponds to the SiC layer 13A, and "Si oxide" corresponds to the Si oxide layer 13B. And "stacked layers of SiC and Si oxide" correspond to the switching layer 13.

Figure 5A:
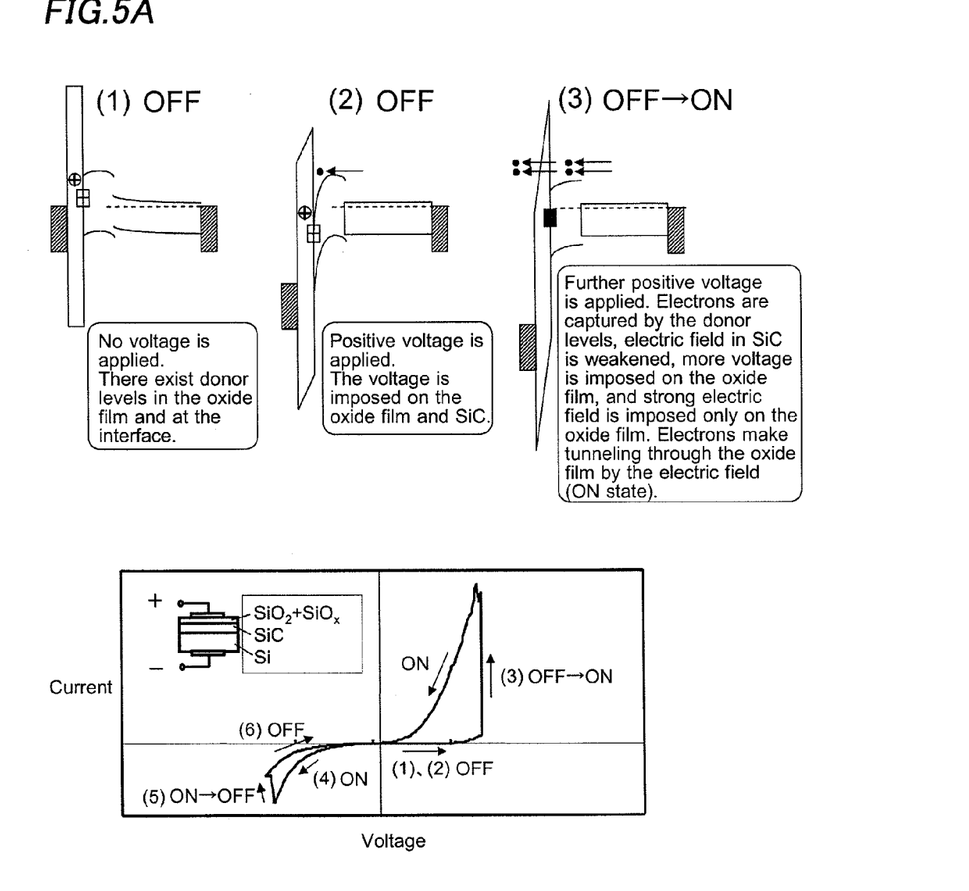
FIGS. 5A and 5B show memory operations of the semiconductor memory device according to the embodiment of this invention.
Figure 5B:
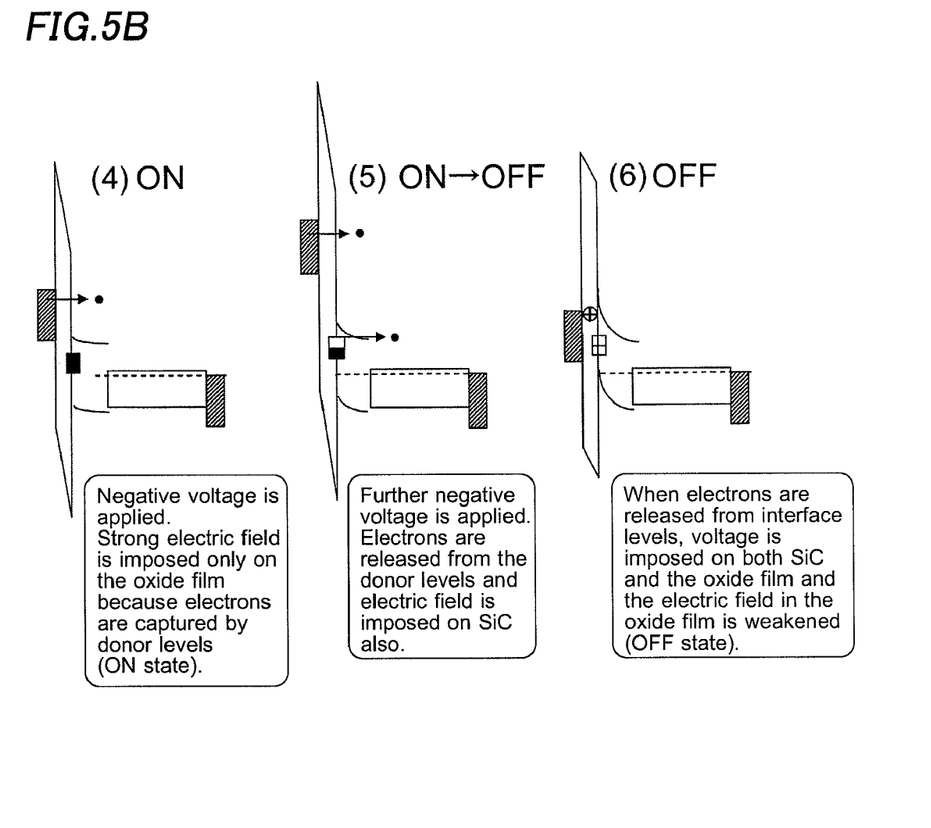

FIG. 5 shows memory operation models using band diagrams. When oxidation temperature is as low as 1000° C., the Si oxide is a mixture of $SiO_2$ that is a complete oxide and $SiO_x$ (x<2) that is an incomplete oxide. Also, since the oxide is formed through a process to remove C in the SiC, there exists, as a crystal defect, Si having dangling bonds, which are not bonded to other atoms, when the temperature is low, and there remains positively charged Si+ as the dangling bonds release electrons. Thus, there are such donor type defects in a region of the Si oxide and at an interface between the Si oxide and the SiC. A larger number of the donor type defects exist particularly at the interface between the Si oxide and the SiC (FIG. 5 (1).).

When a positive voltage is applied to a surface of the Si oxide, the applied voltage is primarily imposed on the Si oxide and the SiC because a resistance of the Si substrate is low. However, almost no current flows because the Si oxide makes a barrier. That is, the memory device as a whole is in the high resistance state. The high resistance state makes the OFF state (FIG. 5 (2)).

A band gap of Si is 1.1 eV, and a band gap of SiC is 2.3 eV in the case of a cubic crystal. When the voltage is further increased and exceeds a certain voltage, electrons are injected from the Si substrate to the SiC side since there is a band gap difference between the SiC and the Si substrate, and the electrons are captured by a multitude of donor type defects existing in large numbers at the interface between the Si oxide and the SiC. At that time, imposing a voltage becomes harder from the Si substrate to a region in which the electrons are captured, and more voltage is imposed on a region of the Si oxide in which small amount of electrons are captured. As a result, a strong electric field is caused in the Si oxide to induce tunneling of electrons and to make a current flow. Thus, the resistance of the memory device as a whole is reduced effectively. The low resistance state makes the ON state (FIG. 5 (3)). Turning from the OFF state to the ON state corresponds to writing-in of the information "1".

When a negative voltage is applied to the surface of the Si oxide while the memory device is in the ON state, the voltage is primarily imposed on the Si oxide and the tunneling of electrons continues to make the current flow because the electrons remain captured by the donor type defects Si+ (FIG. 5 (4)). However, when further negative voltage is applied to the surface of the Si oxide, the captured electrons are released to make Si+ and the electrons are turned back to the Si substrate side. As a result, the voltage is imposed on both the Si oxide and the SiC again (FIG. 5 (5)). Eventually the electric field in the Si oxide is weakened, electrons can no longer make tunneling, and almost no current flows. That is, the resistance of the memory device as a whole is effectively increased and it turns to the OFF state (FIG. 5 (6)). Turning from the ON state to the OFF state corresponds to erasing or writing-in of the information "0".

That is, the memory operations use the donor type defects formed in the Si oxide. It turns to the ON state when the electrons are captured by the donor type defects Si+caused in the Si oxide and at the interface between the Si oxide and the SiC, and turns to the OFF state when the electrons are released from the donor type defects. Therefore, it can be regarded as memory operation that the ON state corresponds to storing a logical value "1" and the OFF state corresponds to storing a logical value "0". The OFF state can be turned to the ON state by increasing the voltage applied to the Si oxide large enough to the positive side, and the ON state can be turned to the OFF state by increasing the voltage large enough to the negative side on the contrary. And whether the stored value of the device is "0" (OFF state) or "1" (ON state) can be read out by checking whether the current flows or not at the low voltage.

Note that a larger number of donor type defects can be formed by oxidizing SiC than by oxidizing Si directly. This is because removing C and forming Si oxide can be made more easily by oxidizing SiC. And the existence of the SiC causes the case in which the voltage is imposed on both the SiC and the Si oxide and the case in which it is imposed only on the Si oxide depending on whether the electrons are captured or not by the defects, and varies the easiness of the current flow, that is, the resistance of the memory device.

Figure 6:
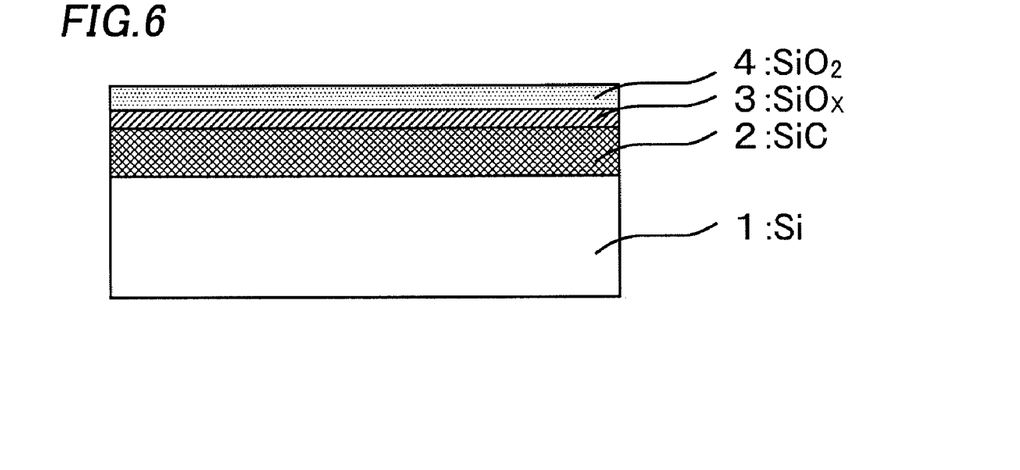
FIG. 6 shows a structure of the semiconductor memory device according to the embodiment of this invention.

FIG. 6 shows the structure of the semiconductor memory device. 1 denotes the Si substrate layer, 2 denotes the SiC layer, 3 denotes a second Si oxide layer and 4 denotes a first Si oxide layer. The Si substrate layer 1 uses a Si (111) substrate doped to N type. This is because the memory operations can be efficiently realized when the N type Si substrate having high electron density is used. And it is better that the SiC itself formed on the Si substrate layer 1 has high crystallinity with few defects, because an amount of the Si+ defects is controlled in the Si oxide and at the interface between the Si oxide and the SiC. A film of the SiC of high crystallinity can be formed when a plane direction of the Si substrate is (111).

Figure 7:
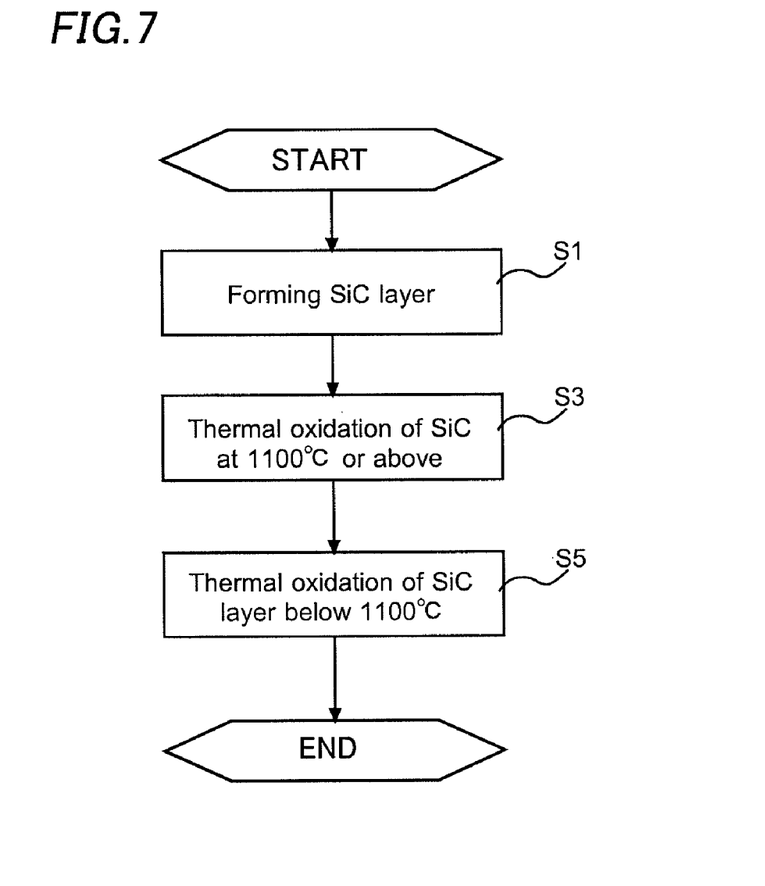
FIG. 7 is a flow chart showing a manufacturing method of the semiconductor memory device according to the embodiment of this invention.

The manufacturing method of the semiconductor memory device is explained hereafter using a flow chart shown in FIG. 7. The SiC layer 2 is formed by CVD method on the Si (111) substrate layer 1 doped to N type (step S1). The SiC layer 2 may be either doped or undoped. Or, the SiC layer 2 doped to P type may be formed on the Si substrate layer 1 that is doped to N type.

Next, oxygen is introduced into thermal oxidation apparatus to thermally oxidize the SiC in an oxidizing atmosphere at 1100° C. or above. Herewith the first Si oxide layer 4 is formed on the SiC layer 2 (step S3). A thickness of the first Si oxide layer 4 is preferably 2-20 nm.

Figure 8:
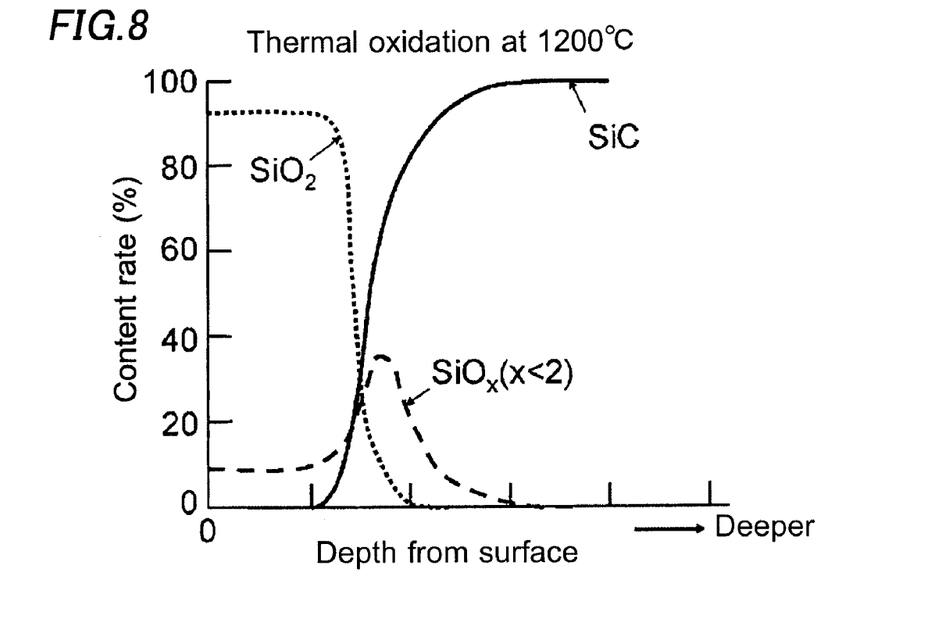
FIG. 8 shows $SiO_2$ and SiOx content rates when SiC is thermally oxidized at 1200° C.

Since the first Si oxide layer 4 is formed by thermal oxidation of the SiC at high temperature, a $SiO_2$ content rate can be made 90% or above. FIG. 8 shows the Si oxide content rate in a direction of depth from the surface of the Si oxide when the SiC is thermally oxidized at 1200° C. As seen from FIG. 8, the content rate of $SiO_2$, that is a complete oxide, is about 90% from the surface of the Si oxide to a vicinity of the interface with the SiC. On the other hand, the content rate of SiOx, that is an incomplete oxide, is only about 10% on the surface of the Si oxide and only about 30% even in the vicinity of the interface with the SiC. Therefore, it is considered that the first Si oxide layer 4 is mostly made of $SiO_2$ that is a complete oxide.

Next, the oxidation temperature is reduced to below 1100° C., and the SiC is thermally oxidized. Herewith the second Si oxide layer 3 is formed between the SiC layer 2 and the first Si oxide layer 4 (step S5). A thickness of the second Si oxide layer 3 is preferably 10 nm or below.

Figure 9:
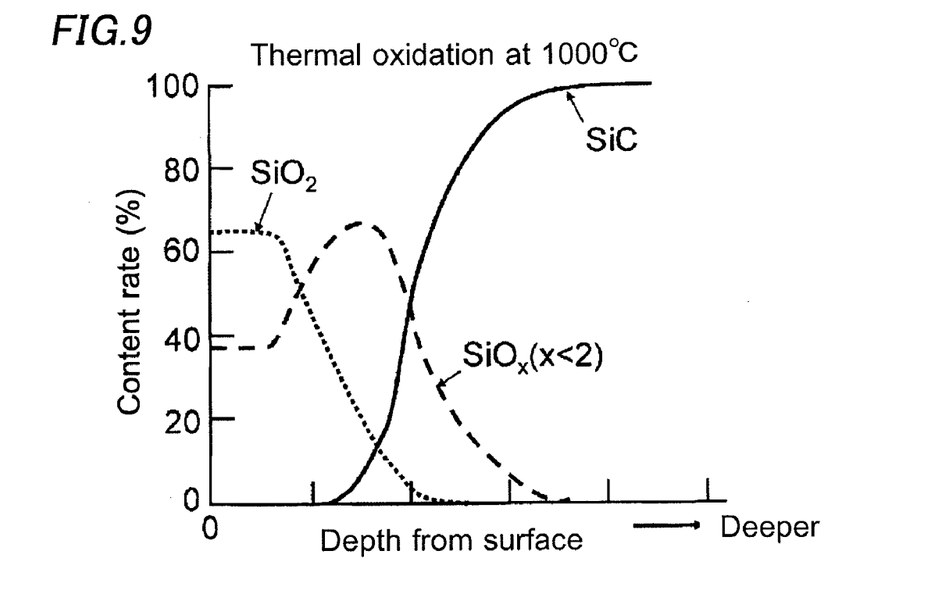
FIG. 9 shows $SiO_2$ and SiOx content rates when SiC is thermally oxidized at 1000° C.

The content rate of the SiOx, which is an incomplete oxide, in the second Si oxide layer 3 is higher than in the first Si oxide layer 4, since the SiC is thermally oxidized at the temperature lower than the first Si oxide layer 4. FIG. 9 shows the Si oxide content rate in a direction of depth from the surface of the Si oxide when the SiC is thermally oxidized at 1000° C. As seen from FIG. 9, the content rate of $SiO_2$, that is the complete oxide, is about 65% at the surface of the Si oxide, which is lower than in the case where the thermal oxidation is made at 1200° C. On the other hand, the content rate of SiOx, that is the incomplete oxide, is as high as about 35% at the surface and about 65% in the vicinity of the interface with the SiC. Therefore, it is considered that the second Si oxide layer 3 is formed to be mixed with SiOx that is the incomplete oxide.

It is noted that a Si (100) substrate may be used as the Si substrate layer 1. Also, thermal treatment may be performed in an inert atmosphere such as in Ar as appropriate, after forming the SiC or after forming the Si oxide layer. Also, the first and second Si oxide layers may be formed using a mixed gas of $SiH_4$ and $N_2O$ and using a deposition method to deposit the Si oxide layer on the SiC by a chemical vapor deposition method (CVD method). The first Si oxide layer may be formed by the deposition method after the second Si oxide layer is formed by thermally oxidizing the SiC in an oxidizing atmosphere. Also, both the second and first Si oxide layers may be formed by the deposition method.

Figure 10:
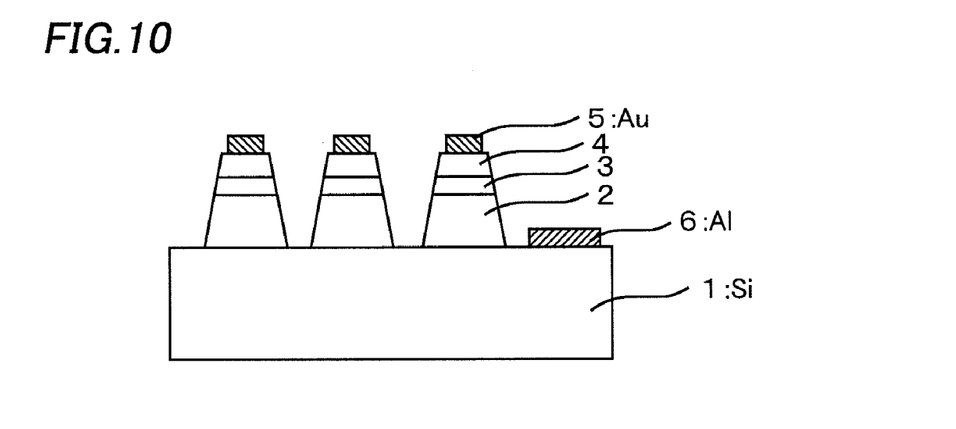
FIG. 10 shows a structure of a mesa type semiconductor memory device in the embodiment of this invention.

To integrate the memory device, the first Si oxide layer 4, the second Si oxide layer 3 and the SiC layer 2 are etched into a mesa type and electrodes 5 and 6 are formed on the first Si oxide layer 4 and on the Si substrate layer 1, respectively, as shown in FIG. 10. Au, Pt, Ni, Al or the like is used to form the electrodes. A multitude of the mesa type memory devices may be wired three-dimensionally thereabove so that one of the memory devices is electrically selected.

The manufacturing method is hereafter explained more concretely. The SiC layer 2 of a thickness of 400 angstroms was epitaxially formed by CVD method on the Si (100) substrate layer 1 that is doped to N type and of 0.1-0.5 Ωcm. Next, oxygen was introduced into thermal oxidation apparatus to form the first Si oxide layer 4 by oxidation in the oxidizing atmosphere at 1200° C. for three minutes. A thickness of the first Si oxide layer 4 was 12 nm.

Next, the oxidation temperature was lowered to 1000° C. and oxidation was carried out for five minutes to form the second Si oxide layer 3. A thickness of the second Si oxide layer 3 was 2 nm.

Next, the first Si oxide layer 4, the second Si oxide layer 3 and the SiC layer 2 were etched into the mesa type, and Au electrodes 5 were formed on the first Si oxide layers 4, and an Al electrode 6 was formed on the Si substrate layer 1. After that, three-dimensional wiring was formed above the mesa type to constitute an integrated type memory device. As a result of analysis by X-ray photoelectron spectroscopy, the first Si oxide layer 4 contained $SiO_2$ 95-100%, and the second Si oxide layer 3 contained $SiO_2$ 50-89%.

Figure 11:
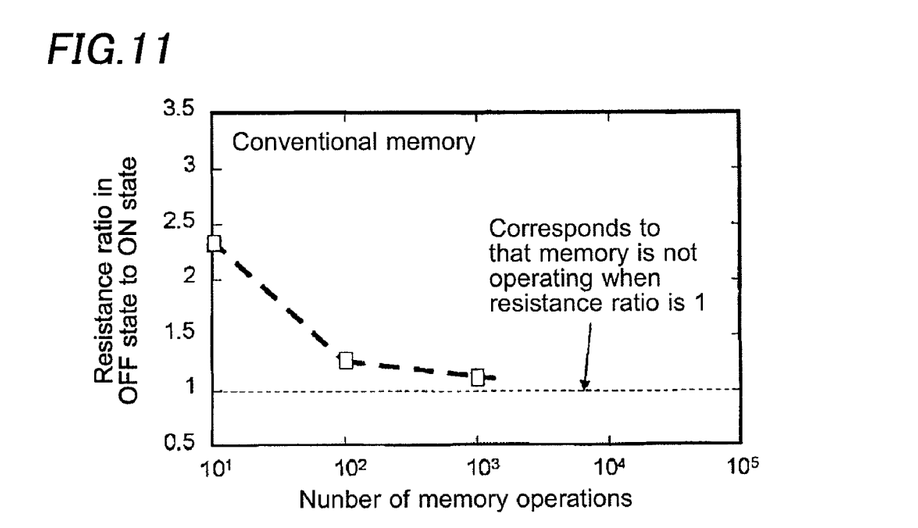
FIG. 11 shows results of measurements to measure dynamic characteristics of the number of memory operations of a semiconductor memory device in a conventional structure.
Figure 12:
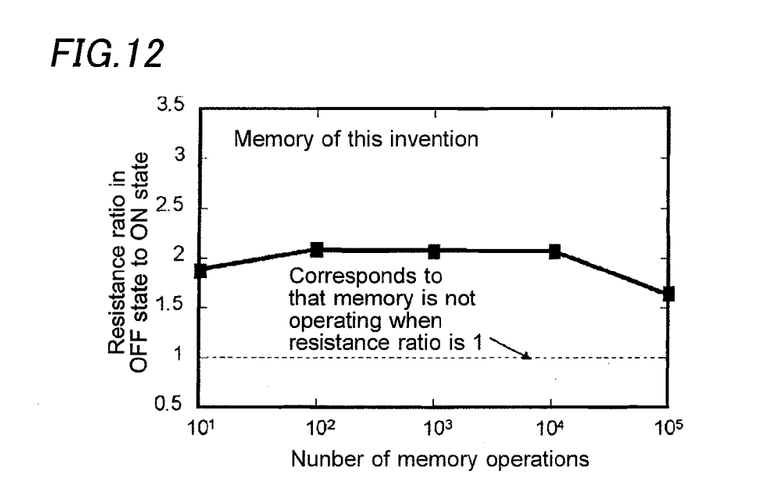
FIG. 12 shows results of measurements to measure dynamic characteristics of the number of memory operations of the semiconductor memory device in the embodiment of this invention.

FIG. 11 shows results of measurements to measure the number of memory operations of the semiconductor memory device according to the conventional structure. FIG. 12 shows results of measurements to measure the number of memory operations of the semiconductor memory device according to the embodiment described above. Note that vertical axes in FIG. 11 and FIG. 12 represent a ratio of the resistance of the memory in the OFF state to the resistance of the memory in the ON state, that is, how harder for the current to flow in the OFF state compared with in the ON state. When the resistance ratio is equal to 1, there is no difference between the current in the ON state and the current in the OFF state, which corresponds to that it is not operating as a memory.

In the embodiment, repetition characteristic is improved by more than 1000 times compared with the conventional case having only one Si oxide layer that is thermally oxidized at 1000° C. And while the resistance ratio approaches to 1 making the memory operation difficult when the number of memory operations exceeds 100 times in the conventional case, the resistance ratio is larger than 1.5 and is capable of making stable memory operations even when the number of operations exceeds $10^5$ times in the case of the embodiment. And because the region of the defects that captures electrons can be restricted to a very narrow range of 2 nm that is the thickness of the second Si oxide layer 3, the captured electrons are released easily and the number of ON (corresponds to writing-in of the information "1")/OFF (corresponds to erasing or writing-in of the information "0") repetitions reached $10^5$ times or above.

Similar effects can be obtained by adopting a double layer structure of the first Si oxide layer 4 and the second Si oxide layer 3 as the structure of the Si oxide layer 13B of the switching layer 13.

Note that this invention is not limited to the embodiment described above, and may be modified within the scope of the invention. For example, although the N+ type Si layer 11 is formed on the P type Si substrate 10 and the switching layer 13 is formed on the N+ type Si layer 11 in the embodiment, a P+ type Si layer may be formed on an N type Si substrate and the switching layer 13 may be formed on the N+ type Si layer.

The invention claimed is:

1. A semiconductor memory device comprising:
   a substrate;
   a plurality of word lines extending over the substrate, each of the word lines comprising a silicon layer;
   a plurality of bit lines extending over the substrate and intersecting the word lines in plan view of the substrate; and
   a plurality of switching layers disposed at intersections between the bit lines and the word lines, each of the switching layers being configured to be switched from an ON state to an OFF state and from the OFF state to the ON state and comprising a SiC layer disposed on a corresponding silicon layer and a silicon oxide layer disposed on the SiC layer so as to be electrically connected to a corresponding bit line.

2. The semiconductor memory device of claim 1, wherein the silicon oxide layer comprises a first silicon oxide layer disposed on the SiC layer and a second silicon oxide layer disposed on the first silicon oxide layer, and wherein a silicon oxide content of the second silicon oxide layer is greater than a silicon oxide content of the first silicon oxide layer.

* * * * *